United States Patent
Kiep et al.

(10) Patent No.: US 10,712,208 B2
(45) Date of Patent: Jul. 14, 2020

(54) INTEGRATED TEMPERATURE SENSOR FOR DISCRETE SEMICONDUCTOR DEVICES

(71) Applicant: Infineon Technologies AG, Neubiberg (DE)

(72) Inventors: Andreas Kiep, Munich (DE); Holger Ruething, Munich (DE); Frank Wolter, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/142,824

(22) Filed: Sep. 26, 2018

(65) Prior Publication Data

US 2019/0025132 A1 Jan. 24, 2019

Related U.S. Application Data

(63) Continuation of application No. 14/329,389, filed on Jul. 11, 2014, now Pat. No. 10,132,696.

(51) Int. Cl.
*G01K 7/01* (2006.01)
*H01L 27/06* (2006.01)

(52) U.S. Cl.
CPC ............ *G01K 7/01* (2013.01); *H01L 27/0664* (2013.01); *H01L 27/0629* (2013.01)

(58) Field of Classification Search
CPC .... G01K 7/01; H01L 27/0664; H01L 27/0629
See application file for complete search history.

(56) References Cited

U.S. PATENT DOCUMENTS

| | | | |
|---|---|---|---|
| 5,642,252 A | 6/1997 | Sakamoto et al. | |
| 5,736,769 A | 4/1998 | Nishiura et al. | |
| 6,046,470 A * | 4/2000 | Williams | ............ H01L 27/0248 257/328 |
| 6,316,971 B1 * | 11/2001 | Ohashi | ..................... G01K 7/01 327/512 |

(Continued)

FOREIGN PATENT DOCUMENTS

| CN | 1249441 C | 4/2006 |
|---|---|---|
| CN | 101438030 A | 5/2009 |

(Continued)

OTHER PUBLICATIONS

Conghui, Xu et al., "An Ultra Low Power CMOS Temperature Sensor for RFID Applications", Journal of Semiconductors, Apr. 2009, vol. 30, No. 4, State Key Laboratory of ASIC & System, Fudan University, Shanghai, China, 2009 Chinese Institute of Electronics, pp. 1-4.

(Continued)

*Primary Examiner* — Daniel R Miller
(74) *Attorney, Agent, or Firm* — Murphy, Bilak & Homiller, PLLC

(57) ABSTRACT

A semiconductor die includes a single power transistor or power diode, a temperature sense diode formed close enough to the single power transistor or power diode to measure an accurate temperature. The temperature sense diode comprises first and second diodes or strings of diodes. A separate integrated circuit is operable to measure first and second voltage drops of both the first and second diodes or strings of diodes using same magnitude currents, and estimate the temperature of the single power transistor or power diode based on the difference between the first and second forward voltage drop measurements. An overall pn junction area of the first diode or string of first diodes is different from an overall pn junction area of the second diode or string of second diodes.

13 Claims, 7 Drawing Sheets

(56) References Cited

U.S. PATENT DOCUMENTS

| | | | |
|---|---|---|---|
| 2004/0041573 A1 | 3/2004 | Klemm et al. | |
| 2005/0078723 A1 | 4/2005 | Han et al. | |
| 2005/0156267 A1 | 7/2005 | Mori et al. | |
| 2005/0259718 A1 | 11/2005 | Phan et al. | |
| 2006/0193370 A1 | 8/2006 | St. Pierre et al. | |
| 2006/0255361 A1* | 11/2006 | Oyabe | G01K 7/015 257/139 |
| 2012/0032696 A1 | 2/2012 | Morino et al. | |
| 2013/0060499 A1 | 3/2013 | Yoshimura | |
| 2015/0346038 A1 | 12/2015 | Osanai | |

FOREIGN PATENT DOCUMENTS

| | | |
|---|---|---|
| CN | 101795514 A | 8/2010 |
| CN | 102016510 A | 4/2011 |
| CN | 102998016 A | 3/2013 |
| CN | 103368412 A | 10/2013 |
| EP | 0744770 A2 | 11/1996 |
| JP | 2006349417 A | 12/2006 |

OTHER PUBLICATIONS

Jones, Michael, "Accurate Temperature Sensing with an External P-N Junction", Linear Technology, Application Note 137, May 2012, Linear Technology Corporation, Milpitas, California, pp. 1-12.

Smith, Matt, "Measuring Temperatures on Computer Chips with Speed and Accuracy: A New Approach Using Silicon Sensors and Off-Chip Processing", Interface Products, ADI Limerick Ireland, Analog Devices 1999, Analog Dialogue 33-4, pp. 1-5.

\* cited by examiner

INTEGRATED TEMPERATURE SENSOR FOR DISCRETE SEMICONDUCTOR DEVICES

RELATED APPLICATIONS

This application is a continuation of and claims priority to U.S. patent application Ser. No. 14/329,389 filed on Jul. 11, 2014, the entire contents of which are incorporated herein by reference.

TECHNICAL FIELD

The instant application relates to discrete semiconductor devices, and more particularly to measuring the temperature of discrete semiconductor devices.

BACKGROUND

Some discrete power semiconductor devices such as IGBTs (insulated gate bipolar transistors), MOSFETs (metal oxide semiconductor field effect transistors), JFETs (junction field effect transistors), power diodes, etc. include an integrated polysilicon diode as a temperature sensor. A known fixed current is driven through the polysilicon diode and the absolute forward voltage drop of the diode is measured. Ideally, the absolute forward voltage drop of the diode decreases linearly with temperature. Hence, the junction temperature of the diode can be directly concluded from the measured forward voltage drop using a known relationship between forward voltage drop and diode junction temperature. However, production variation inherent in semiconductor manufacturing causes a wide variation in the forward voltage behavior of polysilicon diodes. As a result, the accuracy of polysilicon diode based temperature sensors is relatively low.

In addition, the resistance of traces inside the semiconductor die (chip) from the external terminal to the polysilicon diode and back to the terminal increase the error. Current flowing through the diode creates not only a forward voltage drop across the pn junction of the diode, but also a voltage drop within the traces. Hence, the measured diode voltage is greater than the actual pn junction voltage. While the sign of the error is known, the absolute magnitude is not, further compounding the measurement error.

Furthermore, variations of the test current driven through the diode also introduce error. For example, if the test current increases e.g. due to temperature changes or lot-to-lot changes of that test circuit, then the forward voltage of the diodes increases and this is erroneously interpret as lower temperature. In view of the above and other considerations such as lower cost and complexity, a more accurate temperature sensor and temperature sensing technique is desired for discrete power semiconductors.

SUMMARY

According to an embodiment of a circuit, the circuit comprises a semiconductor die comprising a discrete semiconductor device and at least one diode. The circuit further comprises an integrated circuit operable to measure a first forward voltage drop of the at least one diode under a first test condition, measure a second forward voltage drop of the at least one diode under a second test condition and estimate the temperature of the discrete semiconductor device based on the difference between the first and second forward voltage drop measurements.

According to another embodiment of the circuit, a semiconductor die comprises a single power transistor or power diode, at least one temperature sense diode formed close enough to the single power transistor or power diode so that a junction temperature of the at least one temperature sense diode is an accurate representation of the temperature of the single power transistor or power diode. The at least one temperature sense diode comprises a first diode or string of first diodes, and a second diode or string of second diodes. An integrated circuit that is separate from the semiconductor die and operable to measure a first forward voltage drop of the first diode or string of first diodes by driving a first known current through the first diode or string of first diodes, measure a second forward voltage drop of the second diode or string of second diodes by driving a second known current through the second diode or string of second diodes, and estimate the temperature of the single power transistor or power diode based on the difference between the first and second forward voltage drop measurements. The first and second driving currents have the same magnitude. An overall pn junction area of the first diode or string of first diodes is different from an overall pn junction area of the second diode or string of second diodes.

According to an embodiment of a method of determining the temperature of a discrete semiconductor device included in a semiconductor die that also comprises at least one diode, the method comprises: measuring a first forward voltage drop of the at least one diode under a first test condition; measuring a second forward voltage drop of the at least one diode under a second test condition; and estimating the temperature of the discrete semiconductor device based on the difference between the first and second forward voltage drop measurements.

According to an embodiment of a method determining the temperature of a single power transistor or power diode included in a semiconductor die that also comprises at least one temperature sense diode formed close enough to the single power transistor or power diode so that a junction temperature of the at least one temperature sense diode is an accurate representation of the temperature of the single power transistor or power diode, the at least one temperature sense diode comprising a first diode or string of first diodes, and a second diode or string of second diodes, the method comprises, using an integrated circuit that is separate from the semiconductor die, driving a first known current through the first diode or string of first diodes under a first test condition, measuring a first forward voltage drop of the first diode or string of first diodes under the first test condition, driving a second known current through the second diode or string of second diodes under a second test condition, measuring a second forward voltage drop of the second diode or string of second diodes under the second test condition, and estimating the temperature of the single power transistor or power diode based on the difference between the first and second forward voltage drop measurements. The first and second driving currents have the same magnitude. An overall pn junction area of the first diode or string of first diodes is different from an overall pn junction area of the second diode or string of second diodes.

According to an embodiment of a semiconductor die, the die comprises a discrete transistor, a first diode or string of first diodes, and a second diode or string of second diodes. The semiconductor die further comprises a first terminal connected to a gate of the discrete transistor, a second terminal connected to a collector or a drain of the discrete transistor, a third terminal connected to an emitter or a source of the discrete transistor, a fourth terminal connected to an anode of the first diode or string of first diodes, and a fifth terminal connected to an anode of the second diode or string of second diodes.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

According to embodiments described herein, temperature sensors and temperature sensing techniques are provided for discrete power semiconductor devices with high overall accuracy. The temperature sensors and temperature sensing techniques described herein are less susceptible to errors caused by production variation, voltage drop due to resistances of traces within the die (chip) and/or bond wires and/or connectors, and current source variations. The temperature sensors and temperature sensing techniques described herein can be used with discrete transistors such as IGBTs, MOSFETs, JFETs, etc. and discrete diodes. In the context of the present specification, the term "MOSFET" should be understood as including the more general term "MISFET" (metal-insulator-semiconductor FET). For example, the term MOSFET should be understood to include FETs having a gate insulator that is not an oxide, i.e. the term MOSFET is used in the more general term meaning of IGFET (insulated-gate field-effect transistor) and MISFET (metal-insulator-semiconductor field-effect transistor), respectively.

Figure 1:
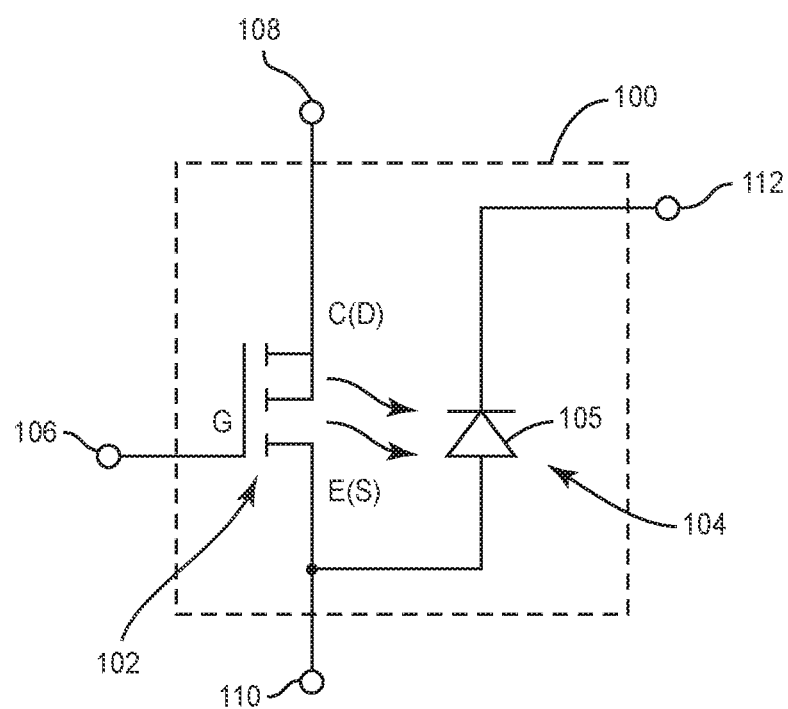
FIG. 1 illustrates a schematic diagram of an embodiment of a discrete semiconductor die with an integrated diode-based temperature sensor.

FIG. 1 illustrates one embodiment of a semiconductor die 100 with an integrated temperature sensor for use in sensing the temperature of a discrete power semiconductor device 102. The discrete power semiconductor device 102 is illustrated as a discrete IGBT in FIG. 1 for merely illustrative purposes and has a gate (G), collector (C) and emitter (E), but could be a discrete MOSFET or discrete JFET where the collector is instead a drain (D) and the emitter is instead a source (S), or a discrete diode. In the case of a discrete MOSFET, the MOSFET has an intrinsic body diode or reverse diode (i.e. anode connected to source, cathode connected to drain) which is not shown in FIG. 1 to avoid confusion. The term 'discrete' as used herein refers to an electronic component with just one circuit element such as a transistor or diode, other than an integrated circuit. In comparison, an integrated circuit typically contains hundreds to billions of circuit elements on a single chip.

The diode-based temperature sensor 104 integrated in the semiconductor die 100 with the discrete power semiconductor device 102 is a single sense diode 105 according to this embodiment, such as a polysilicon diode, Schottky diode, etc. in close proximity to the discrete semiconductor device 102. In general, the diode 105 can be any type of diode that can be integrated with the discrete semiconductor device 102 and has a known forward voltage drop (VF) versus temperature characteristic which allows for estimating the diode junction temperature (Tj) from the relative difference (delta) between two forward voltage drop measurements for the diode 105. That is, the diode 105 has a defined forward voltage drop to junction temperature relationship. The diode 105 is formed close enough to the discrete power semiconductor device 100 so that the junction temperature (Tj) of the diode 105 is an accurate representation of the temperature of discrete power semiconductor device 102. For example, the diode 105 can be embedded within the power semiconductor device 102, e.g. close to its surface.

The semiconductor die 100 further includes a first terminal 106 such as a bond pad connected to the gate of the IGBT or the gate of the MOSFET/JFET, a second terminal 108 connected to the collector of the IGBT or the drain of the MOSFET/JFET, a third terminal 110 connected to the emitter of the IGBT or the source of the MOSFET/JFET, and a fourth terminal 112 connected to the cathode of the temperature sense diode 105. Alternatively, the fourth terminal 112 can be connected to the anode of the temperature sense diode 105 and its cathode can be connected to third terminal 110 (e.g. with the same orientation shown in FIGS. 4 and 5). The terminals 106-112 can be connected to the corresponding nodes of the discrete semiconductor device 102 and the temperature sense diode 105 by one or metal layers, doped semiconductor regions, doped polysilicon regions, etc. In other words, 'connected' as used herein can mean either a direct electrical connection (no intermediary structures or regions) or an indirect electrical connection (one or more intermediary structures or regions). The semiconductor die 100 can also include a fifth terminal (not shown in FIG. 1) connected to the anode of the temperature sense diode 105. Alternatively, the anode of the diode 105 can be internally connected to the emitter of the IGBT or the source of the MOSFET/JFET as shown in FIG. 1, or to the anode or cathode of a discrete diode, and the fifth terminal can be omitted.

In each case, the temperature of the discrete semiconductor device 102 is determined by measuring the forward voltage drop of the temperature sense diode 105 under different test conditions and estimating the temperature of the discrete semiconductor device 102 based on the difference (delta) between the forward voltage drop measurements. Such a relative forward voltage temperature measurement technique is less susceptible to the errors previously described herein, as compared to conventional absolute forward voltage temperature measurement techniques.

Figure 2:
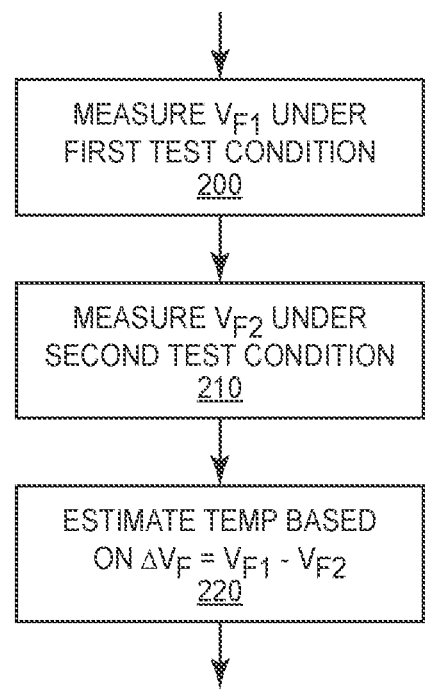
FIG. 2 illustrates a flow diagram of an embodiment of a method of determining the temperature of a discrete semiconductor device based on forward voltage drop measurements for an integrated diode-based temperature sensor.

FIG. 2 illustrates an embodiment of a method of determining the temperature of the discrete semiconductor device 102. The method includes measuring a first forward voltage drop (VF1) of the temperature sense diode 105 under a first test condition (Block 200) and measuring a second forward voltage drop (VF2) of the diode 105 under a second test condition (Block 210). In the case of the embodiment of FIG. 1, the first test condition involves driving a first known current IF1 through the temperature sense diode 105 e.g. via the terminal 110 of the semiconductor die 100 connected to the anode of the diode 105, and the second test condition involves driving a second known current IF2 different than IF1 through the diode 105 e.g. via the same die terminal 110. The different forward voltage drop measurements Vf1, VF2 can be taken via the terminal 112 of the semiconductor die 100 connected to the cathode of the diode 105.

The temperature of the discrete semiconductor device 102 is then estimated based on $\Delta VF=(VF1-VF2)$ i.e. the difference between the first and second forward voltage drop measurements (Block 220). The forward voltages VF1 and VF2 can be measured in succession via the die terminals 110, 112 connected to the anode and cathode of the temperature sense diode 105.

Figure 3:
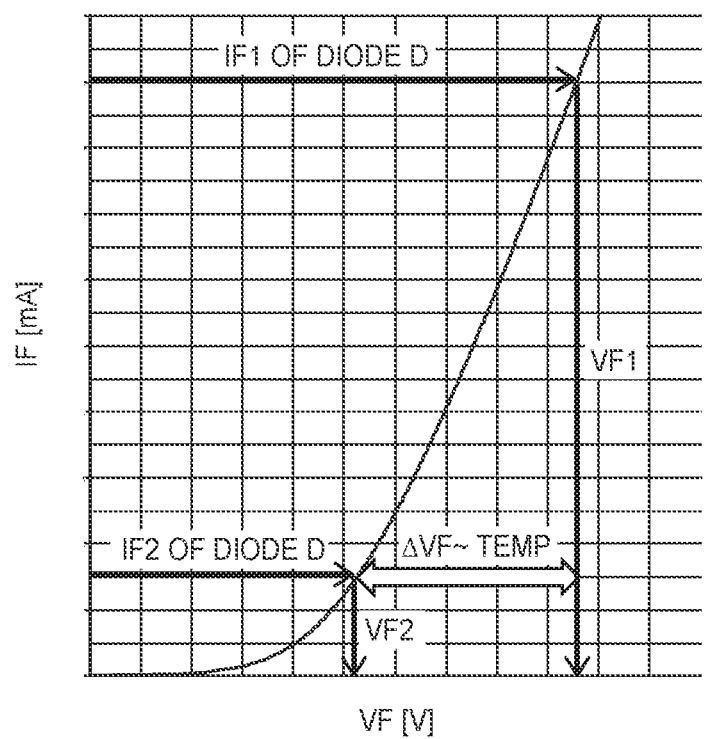
FIG. 3 illustrates a plot diagram showing how temperature of a discrete semiconductor die is determined based on the difference between two forward voltage drop measurements for the integrated diode-based temperature sensor of FIG. 1.

The measurement of the forward voltage drop VF of the temperature sense diode 105 is a relative measurement i.e. $\Delta VF$ measurement, where $\Delta VF$ is given by:

$$\Delta VF = v * \frac{k*T}{q} * \ln\frac{IF1}{IF2} \quad (1)$$

and where:
v is an emission factor or quality factor
k is Boltzmann constant
q is elementary charge
T is absolute temperature of the diode According to this relative measurement technique, the measurement result is significantly less prone to production variation of sense diodes as well as production variation (and temperature based changes) of current sources IF, IF1, IF2. The result is a temperature estimate not directly based on an absolute VF measurement, but rather based on a relative $\Delta VF$ computation. That is, the forward voltage drop VF of one diode is measured twice: once at low current e.g. IF1 and VF1 is measured; and once at a larger current e.g. IF2 and VF2 is measured. The difference between VF1 and VF2 is directly proportional to absolute temperature measured in Kelvin as shown in FIG. 3, where the temperature sense diode 105 shown in FIG. 1 is referred to as 'diode D' in FIG. 3 (in FIG. 3, IF1 is the larger current and IF2 is the smaller current, hence, VF1 is larger than VF2).

According to equation (1), $\Delta VF$ increases linearly with absolute temperature T i.e. $\Delta VF=(VF1-VF2)\sim$absolute temperature T. Also, $\Delta VF$ is independent of saturation current and therefore not prone to errors caused by production variation. Instead, the current ratio IF1/IF2 determines the overall accuracy of the diode-based temperature sensor. The forward voltage drop difference $\Delta VF$ can be directly used to estimate the temperature of the discrete semiconductor device 102. In the case of the diode-based temperature sensor 104 including a single temperature sense diode 105 as shown in FIG. 1, the resulting signal magnitude is small. For example, $\Delta VF/\Delta Temperature<1$ mV/Kelvin for a single polysilicon diode, and more typically between 0.2 to 0.4 mV/K. To increase the signal magnitude, the diode-based temperature sensor can include more than one diode.

Figure 4:
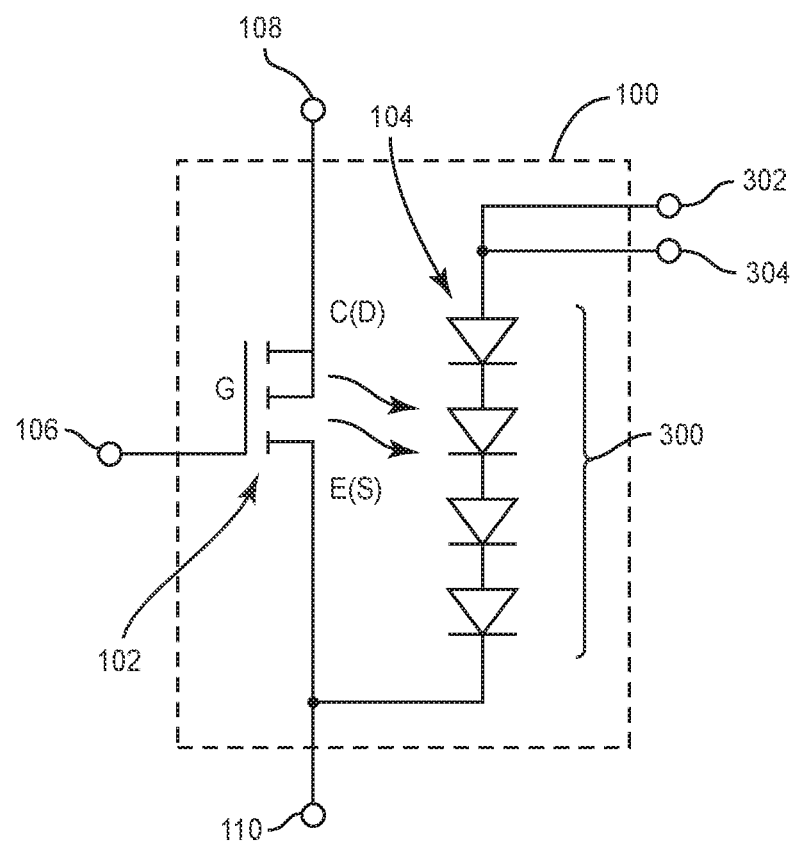
FIG. 4 illustrates a schematic diagram of another embodiment of a discrete semiconductor die with an integrated diode-based temperature sensor implemented as a string of diodes having a force and sense terminal.

FIG. 4 illustrates another embodiment of the diode-based temperature sensor 104 for use in sensing the temperature of a discrete power semiconductor device 102. The embodiment shown in FIG. 4 is similar to the embodiment of FIG. 1. However, the diode-based temperature sensor 104 includes a single string of diodes 300. FIG. 4 shows four diodes in the diode string 300 for purely illustrative purposes. In general, if "n" diodes are connected in series (i.e. in a string), then the voltage difference increases to $n*\Delta VF$. Also according to this embodiment, the semiconductor die 100 has separate force and sense terminals 302, 304 for driving the test currents IF1 and IF2 through the string of diodes 300 and measuring the corresponding forward voltage drops VF1 and VF2, respectively. Forward voltage drop VFx is measured between terminals 304 and 110 while current IFx is driven into terminal 302.

Figure 5:
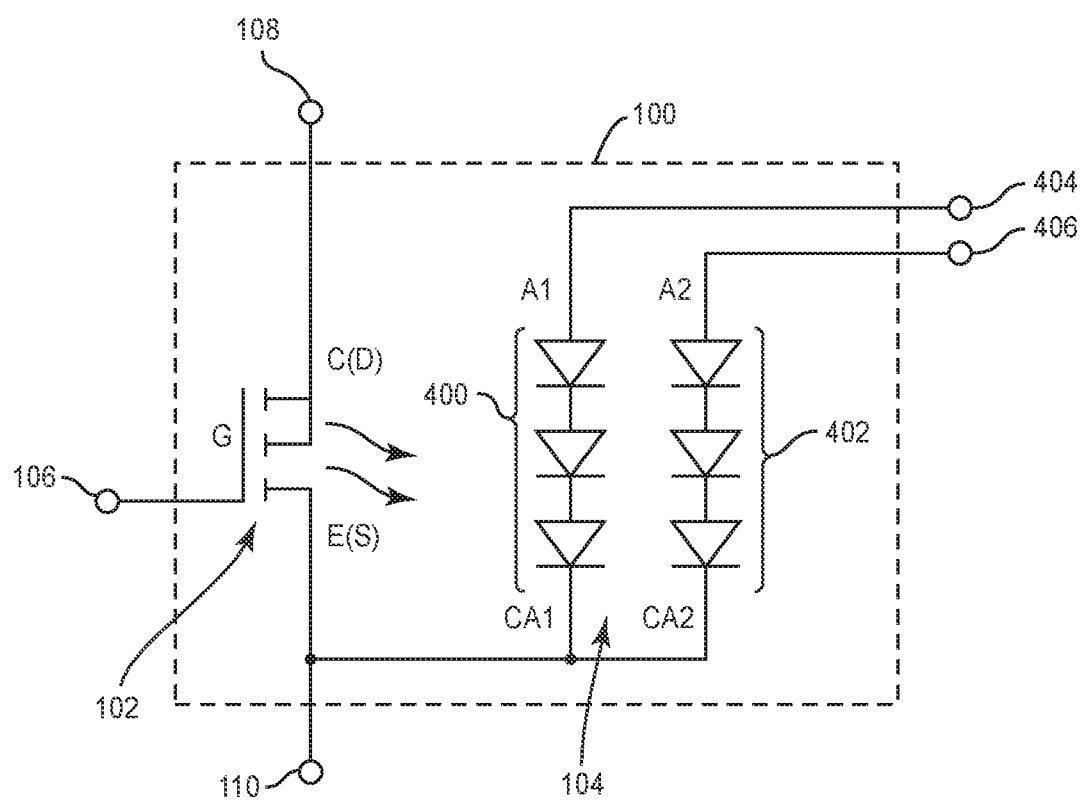
FIG. 5 illustrates a schematic diagram of yet another embodiment of a discrete semiconductor die with an integrated diode-based temperature sensor implemented as two parallel strings of diodes.

In general, the gain or sensitivity (measured in mV/Kelvin) of the diode-based temperature sensor 104 depends upon the ratio IF1/IF2 of the test currents and typically ranges between about 0.2 and 0.4 mV/K. This is compared to conventional temperature sensors which have a gain or sensitivity that ranges between 1.4 and 1.6 mV/K. The accuracy (error) of the temperature sensor 104 is determined by $\ln(IF1/IF2)$. The expression $\ln(IF1/IF2)$ assumes the same pn junction area for the first and second forward voltage drop measurements VF1 and VF2. In the case of the temperature sensor 104 including two diode strings for measuring VF1 and VF2, the current density is relevant. Hence, $\ln(JF1*Area1/JF2*Area2)$ is a more general expression where 'Area1' denotes the pn junction area of the first string of diodes and 'Area2' denotes the pn junction area of the second string of diodes (e.g. as shown in FIG. 5). Hence for the same pn junction area, $\Delta VF$ can be expressed by $\ln(JF1/JF2)$.

FIG. 5 illustrates yet another embodiment of the diode-based temperature sensor 104 for use in sensing the temperature of a discrete power semiconductor device 102. The embodiment shown in FIG. 5 is similar to the embodiments of FIGS. 1 and 4. However, the temperature sensor 104 includes two strings of diodes 400, 402 for estimating the temperature of the discrete semiconductor device 102 instead of one diode string (FIG. 4) or a single diode (FIG. 1). Each diode string 400, 402 has more than one diode in FIG. 5. In general, each diode string 400, 402 can include one or more diodes in series. In general, there are two parallel diodes (or two strings of diodes) and IF1 and IF2 can flow simultaneously. As such, $\Delta VF$ can be measured immediately and read directly. The measuring process can be performed fast, even using simple and low-cost (analog) circuits. Even processing such as comparing $\Delta VF$ (=Temp) to a threshold to determine whether a temperature threshold is reached (e.g. an over temperature warning threshold or an over temperature turn off threshold) can be done immediately and with little additional circuitry. In contrast, in FIG. 1, IF1 and IF2 flow sequentially, and thus, VF1 is measured first, digitized, memorized and afterwards VF2 can be measured, digitized, memorized and finally $\Delta VF$ can be calculated as previously described herein.

The semiconductor die 100 can include a separate terminal (not shown in FIG. 5) connected to the cathode (CA1, CA2) of each diode string 400, 402. Alternatively, the cathode of each diode string 400, 402 can be internally connected to the emitter of the IGBT or the source of the MOSFET/JFET as shown in FIG. 5, or to the anode or cathode of a discrete diode, and this additional terminal can be omitted. Further according to this embodiment, the anode (A1, A2) of each diode string 400, 402 is connected to a different terminal 404, 406 of the semiconductor die 100 for driving test currents through the diode-based temperature sensor 104. The temperature of the discrete power semiconductor device 102 is determined by measuring a first forward voltage drop (VF1) responsive to a first current (IF1) driven through the first diode string 400 via the corresponding die terminal 404, measuring a second forward voltage drop (VF2) responsive to a second current (IF2) driven through the second diode string 402 via the corresponding die terminal 406, and estimating the temperature of the discrete semiconductor device 102 based on the difference between VF1 and VF2.

Forward voltage VF1 can be measured via the die terminals 404, 110 connected to anode A1 and cathode CA1 of the first diode string 400. Forward voltage VF2 can be measured via the die terminals 406, 110 connected to anode A2 and cathode CA2 of the second diode string 402. In one embodiment, the first current IF1 is driven through the first diode string 400 simultaneously with the second current IF2 being driven through the second diode string 402. The difference between VF1 and VF2 can be evaluated in real time and without having to store VF1 and VF2, in order to estimate the temperature of the discrete semiconductor device 102. This way, memory and digital circuitry are not necessarily needed but may be provided if desired. Also, there is no time delay i.e. a real time temperature measurement is available at any single instant. IF1 and IF2 can be driven simultaneously as previously described herein. However, the power semiconductor device 102 itself (IGBT/MOSFET/JFET/diode) may be turned off at that time i.e. no current through the second terminal 108, no significant current through the third terminal 110 (except small IFx). Normally in power electronics circuits, the power semiconductors turn on and off periodically with several kHz to several MHz. If the VFx measurements are conducted during the off-periods, sources of errors are further minimized.

Figure 6:
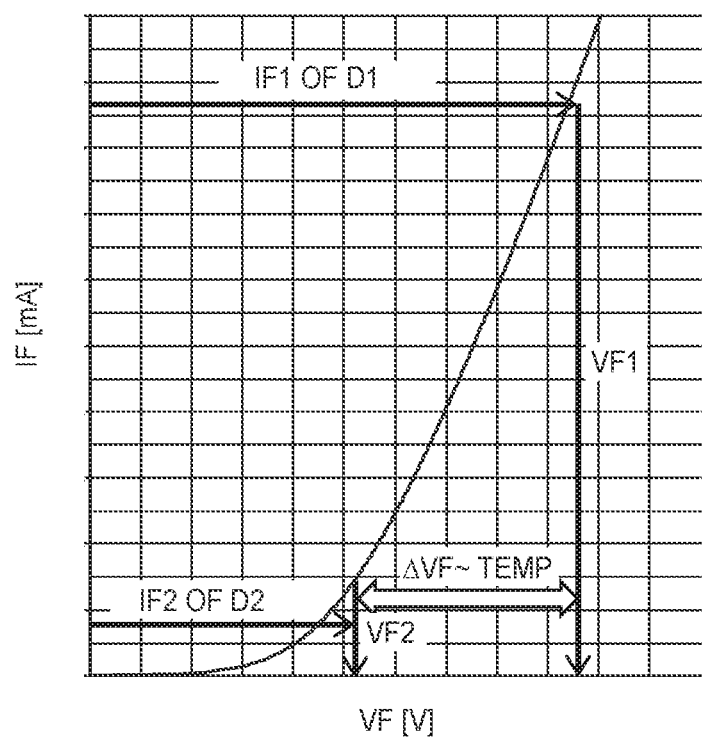
FIG. 6 illustrates a plot diagram showing how temperature of a discrete semiconductor die is determined based on the difference between two forward voltage drop measurements for the integrated diode-based temperature sensor of FIG. 5.

The equation $\ln((JF1*Area1)/(JF2*Area2))$ previously described herein provides an option to further tune $\Delta VF$ by means of a different pn junction area for diode strings 1 or 2. Different test currents IF1≠IF2 can be obtained by using JF1≠JF2 for the same pn junction area, or by using JF1=JF2 and Area1≠Area2 and different combinations of both 'JF' and 'Area'. In one embodiment, the pn junction area of the first diode string 400 is different than the pn junction area of the second diode string 402. According to this embodiment, the first current (IF1) driven into the first diode string 400 can be the same as the second current (IF2) driven into the second diode string 402. In another embodiment, the first and second diode strings 400, 402 have the same pn junction area and IF1≠IF2. In this case, the first current (IF1) driven into the first diode string 400 has a different magnitude than the second current (IF2) driven into the second diode string 402. In either case, VF1≠VF2 and the junction temperature of the diode-based temperature sensor 104 is proportional to $\Delta VF=VF1-VF2$. That is, the difference between VF1 and VF2 is directly proportional to absolute temperature measured in Kelvin as shown in FIG. 6, where the first diode string 400 is referred to as 'D1', the second diode string 402 is referred to as 'D2', IF1≠IF2, and Area1=Area2.

The temperature sense diode, or string of temperature sense diodes, or sense diodes, or strings of temperature sense diodes described herein, are integrated in the semiconductor die 100 and thermally coupled with the discrete semiconductor device 102 so that the junction temperature of the diode-based temperature sensor 104 is an accurate representation of the temperature of discrete semiconductor device 102. The diode-based temperature sensor 104 can be electrically isolated from the discrete semiconductor device 102 i.e. neither the anode nor cathode are electrically connected to any nodes (gate, collector/drain, emitter/source, anode, cathode) of the discrete device 102. Instead, the anode and cathode of the diode-based temperature sensor 104 are electrically isolated from the discrete device nodes 102. Alternatively, the anode or cathode or sense or force terminal of the diode-based temperature sensor 104 can be electrically connected to one or more of the discrete device nodes, for instance to the emitter terminal of a discrete IGBT or the source terminal of a discrete MOSFET/JFET, or to the anode or cathode of a discrete power diode. Such an internal arrangement reduces cost and complexity (the terminal/pad count of the die is reduced, the number of bond wires is reduced, the pin count of the package or module is reduced). For example, a single temperature sense diode can be integrated with a discrete semiconductor device 102 and the anode of the diode can be electrically connected to the emitter of a discrete IGBT or the source of a discrete MOSFET/JFET e.g. as shown in FIG. 1. In another example, a single string of two or more temperature sense diodes in series can be electrically connected to the emitter of a discrete IGBT or the source of a discrete MOSFET/JFET, where the temperature sensor has separate force and sense terminals, e.g. as shown in FIG. 4. In yet another example, two strings of temperature sense diodes, each having one or more diodes in series, can be electrically connected to the emitter of a discrete IGBT or the source of a discrete MOSFET/JFET e.g. as shown in FIG. 5.

Figure 7:
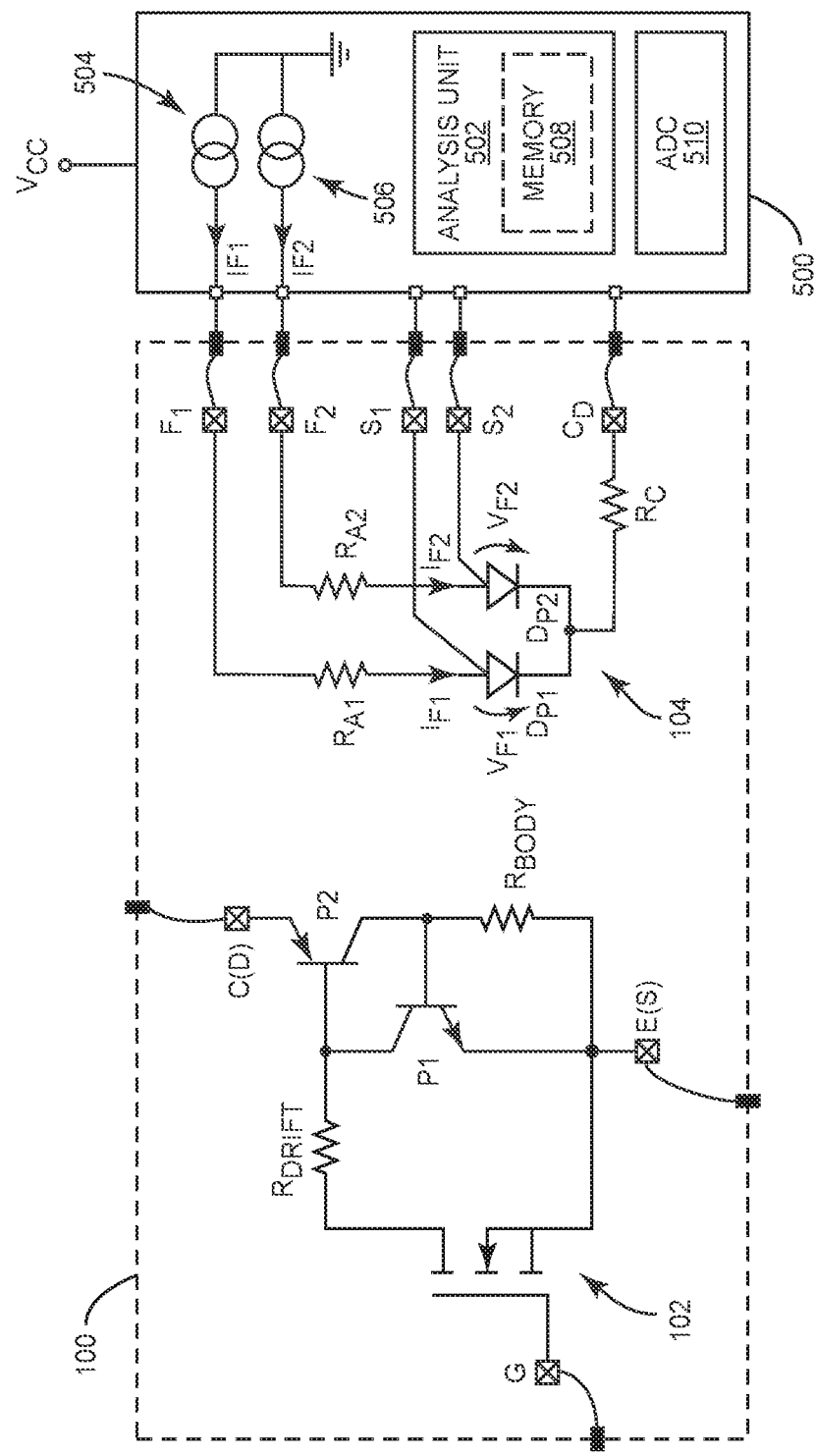
FIG. 7 illustrates a schematic diagram of an embodiment of a circuit including a semiconductor die with a discrete semiconductor device and an integrated diode-based temperature sensor, and an integrated circuit for determining the temperature of the discrete semiconductor device based on forward voltage drop measurements for the integrated diode-based temperature sensor.

FIG. 7 illustrates an embodiment of a circuit that includes a semiconductor die 100 comprising a discrete semiconductor device 102 and a diode-based temperature sensor 104, and an integrated circuit 500 for estimating the temperature of the discrete semiconductor device 102 based on forward voltage measurements for the diode-based temperature sensor 104. The discrete power semiconductor device 102 is illustrated as a discrete IGBT in FIG. 7 for merely illustrative purposes and has a gate (G), collector (C) and emitter (E), but could be a discrete MOSFET or discrete JFET where the collector is instead a drain (D) and the emitter is instead a source (S), or a discrete diode. Depending on the die technology, different types of parasitic devices P1, P2 can be present. The resistance of the transistor drift zone ($R_{DRIFT}$) and body ($R_{BODY}$) are also shown in FIG. 7.

The integrated circuit 500 for estimating the temperature of the discrete semiconductor device 102 can be implemented as a standalone circuit separate from other circuitry that controls the normal functional operation of the discrete semiconductor device 102. Alternatively, the integrated circuit 500 can be an integral part of the circuitry that controls the operation of the discrete semiconductor device 102. For example, the integrated circuit 500 can be implemented as part of a controller or driver programmed or designed to control the normal functional operation of the discrete semiconductor device 102 and to also estimate the temperature of the discrete semiconductor device 102 based on forward voltage measurements for the diode-based temperature sensor 104. The integrated circuit 500 includes an analysis unit 502 for measuring a first forward voltage drop VF1 of the diode-based temperature sensor 104 under a first test condition, measuring a second forward voltage drop VF2 of the diode-based temperature sensor 104 under a second test condition, and estimating the temperature of the discrete semiconductor device 102 based on the difference between VF1 and VF2 as previously described herein.

According to the embodiment shown in FIG. 7, the diode-based temperature sensor 104 includes two temperature sense diodes DP1, DP2 integrated into the semiconductor die 100 (e.g. a power transistor die or a power diode die). The integrated circuit 500 has a first current source 504 for generating a first current IF1 and a second current source 506 for generating a second current IF2. The second current source 506 is matched to the first current source 504 in that the ratio of IF1/IF2 has little temperature variation and also little lot-to-lot variation (i.e. very little IF/IF2 spread over production). In one embodiment, the second current source 506 is matched to the first current source 504 such that the ratio of IF1/IF2 varies by +/−1% or less over a temperature range of −40° C. to 175° C. In general, <1% matching is easily achievable based on the techniques described herein, even 0.25%, and hence, the temperature measurement is very accurate without major effort.

The analysis unit 502 applies current IF1 to a first force terminal (F1) of the semiconductor die 100 and current IF2 to a second force terminal (F2) of the die 100. The first force terminal F1 is connected to the anode of the first temperature sense diode DP1, and the second force terminal F2 is connected to the anode of the second temperature sense diode DP2. Parasitic resistances RA1, RA2 associated with the respective connection paths are shown in FIG. 7. The semiconductor die 100 also includes first and second sense terminals S1, S2 and a common cathode terminal $C_D$ for measuring forward voltage drops across the temperature sense diodes DP1, DP2. The cathodes of the temperature sense diodes DP1, DP2 are internally connected within the die 100 to a common terminal $C_D$ of the die 100 in FIG. 7. Alternatively, the cathodes of the temperature sense diodes DP1, DP2 can be connected to different terminals (not shown in FIG. 7) of the die and therefore not internally connected within the die 100. In either case, the analysis unit 502 measures the forward voltage drop VF1 of the first temperature sense diode DP1 responsive to current IF1 between sense terminal S1 and cathode terminal $C_D$ of the die 100. The analysis unit 502 similarly measures the forward voltage drop VF2 across the second temperature sense diode DP2 responsive to current I2 between sense terminal S2 and cathode terminal $C_D$ of the die 100. A low ohmic path can be provided between the sense terminals S1, S2 of the semiconductor die 100 and the integrated circuit 500 to ensure accurate sensing. In general, the current through the sense terminals S1, S2 is by default very small, much smaller than IF1 and IF2, and hence, the voltage drop across the low ohmic path is very small. Also, only ΔVF counts (=VF1-VF2), and hence, as long the current through S1 and S2 is the same, the erroneous voltage drop in S1 and in S2 cancels out. This is a key quality of the relative measurement techniques described herein, that most errors cancel out.

The analysis unit 502 measures or calculates ΔVF=VF1−VF2, which is directly proportional to the absolute junction temperature (Tj) of the temperature sense diodes (Tj~ΔVF/ Tj~VF1−VF2). The ΔVF measurement or assessment can be performed inside the same integrated circuit that includes the current sources 504, 506. The ΔVF measurement is a relative measurement compared to a conventional absolute measurement where the temperature is estimated based on a single VF measurement. With regard to circuit timing, the current sources 504, 506, the analysis unit 502, the ADC 510, etc. can be synchronized so that the current IFx and the VF measurement and calculation, etc. is synchronized with each other. In addition, the temperature measurement can be synchronized to the periodic switching transition of the discrete semiconductor device 102 in the case of a discrete IGBT/MOSFET/JFET. The integrated circuit 500 can also perform a predetermined action in case a (temperature) threshold is reached, e.g. set a warning flag, increase an error counter, turn off the (overheated) discrete semiconductor device 102 (e.g. the integrated circuit can be part of a driver IC of the discrete semiconductor device 102), signal an over temperature condition has been reached to another circuit like a driver IC or DSP/microcontroller, etc.

The integrated circuit shown in FIG. 7 can be adapted for use with any of the diode-based temperature sensor embodiments described herein. For example with regard to the single temperature sense diode embodiment of FIG. 1, the integrated circuit 500 can include a switch or multiplexer (not shown in FIG. 7 for ease of illustration) for selecting the first current source 504 to drive test current I1 through the single diode 105 and then later selecting the second current source 506 to drive test current I2 through the diode 105. Alternatively, the integrated circuit 500 may include a single programmable current source that can be programmed to drive two different currents IF1, IF2 through the single diode 105 at different times. In either case, the analysis unit 502 is at least partly digital in nature and can include memory 508 for storing the resulting forward voltage measurements VF1, VF. For example, the integrated circuit 502 can include ADC (analog-to-digital converter) circuitry 510 for converting analog forward voltage measurements to corresponding digital representations for storage in the memory 508. The analysis unit 502 estimates the temperature of the discrete semiconductor device based on the difference between the forward voltage drop measurements stored in the memory 508 e.g. based on equation (1). In this case of the single temperature sense diode embodiment of FIG. 1, the semiconductor die 100 needs to only have one force terminal and one sense terminal for measuring the forward voltage drops VF1, VF2 as previously described herein.

With regard to the single temperature sense diode string embodiment of FIG. 4, the integrated circuit 500 can have the same or similar design as for the single temperature sense diode embodiment of FIG. 1 in that the single string of diodes 300 can be viewed as one diode from the perspective of the integrated circuit 500 with respect to measuring the forward voltage drops VF1, VF2. With regard to the dual temperature sense diode string embodiment of FIG. 5, the integrated circuit 500 can have the same or similar design as shown in FIG. 7 in that each string of diodes 400, 402 can be viewed as one diode from the perspective of the integrated circuit 500 with respect to measuring the forward voltage drops VF1, VF2. In each case, the integrated circuit 500 has a relatively low temperature measurement error.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a". "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A circuit, comprising:
a semiconductor die comprising: a single power transistor; at least one temperature sense diode formed close enough to the single power transistor so that a junction temperature of the at least one temperature sense diode is an accurate representation of the temperature of the single power transistor, the at least one temperature sense diode comprising: a first diode or string of first diodes, and a second diode or string of second diodes;
an integrated circuit that is separate from the semiconductor die and operable to:
measure a first forward voltage drop of the first diode or string of first diodes by driving a first known current through the first diode or string of first diodes;
measure a second forward voltage drop of the second diode or string of second diodes by driving a second known current through the second diode or string of second diodes; and
estimate the temperature of the single power transistor based on the difference between the first and second forward voltage drop measurements,
wherein the first and second driving currents have the same magnitude, and
wherein an overall pn junction area of the first diode or string of first diodes is different from an overall pn junction area of the second diode or string of second diodes,
wherein the single power transistor is an IGBT having a collector, an emitter and a gate or a FET having a drain, a source and a gate, wherein a cathode of the first diode or string of first diodes and a cathode of the second diode or string of second diodes are directly electrically connected to the emitter of the IGBT or the source of the FET.

2. The circuit of claim 1, and wherein the semiconductor die comprises a first terminal connected to the gate of the IGBT or the gate of the FET, a second terminal connected to the collector of the IGBT or the drain of the FET, a third terminal connected to the emitter of the IGBT or the source of the FET, a fourth terminal connected to an anode of the first diode or string of first diodes, and a fifth terminal connected to an anode of the second diode or string of second diodes.

3. The circuit of claim 1, wherein the integrated circuit is operable to:
store the first forward voltage drop measurement;
store the second forward voltage drop measurement; and
estimate the temperature of the single power transistor or power diode based on the difference between the stored forward voltage drop measurements.

4. The circuit of claim 1, wherein the at least one temperature sense diode comprises the string of first diodes and the string of second diodes.

5. The circuit of claim 1, further comprising a single programmable current source that can be programmed to drive the first and second known currents.

6. The circuit of claim 5, wherein the integrated circuit comprises the single current source.

7. A method of determining the temperature of a single power transistor included in a semiconductor die that also comprises at least one temperature sense diode formed close enough to the single power transistor so that a junction temperature of the at least one temperature sense diode is an accurate representation of the temperature of the single power transistor, the at least one temperature sense diode comprising: a first diode or string of first diodes, and a second diode or string of second diodes; the method comprising, using an integrated circuit that is separate from the semiconductor die:
driving a first known current through the first diode or string of first diodes under a first test condition;
measuring a first forward voltage drop of the first diode or string of first diodes under the first test condition;
driving a second known current through the second diode or string of second diodes under a second test condition;
measuring a second forward voltage drop of the second diode or string of second diodes under the second test condition; and
estimating the temperature of the single power transistor based on the difference between the first and second forward voltage drop measurements,
wherein the first and second driving currents have the same magnitude, and
wherein an overall pn junction area of the first diode or string of first diodes is different from an overall pn junction area of the second diode or string of second diodes,
wherein the single power transistor is an IGBT having a collector, an emitter and a gate or a FET having a drain, a source and a gate, wherein a cathode of the first diode or string of first diodes and a cathode of the second diode or string of second diodes are directly electrically connected to the emitter of the IGBT or the source of the FET.

8. The method of claim 7, wherein the first and second driving currents are each generated by a single current source.

9. The method of claim 8, wherein the integrated circuit comprises the single current source.

10. The method of claim 7, wherein estimating the temperature of the single power transistor comprises:
storing the first forward voltage drop measurement;
storing the second forward voltage drop measurement; and
estimating the temperature of the single power transistor or power diode based on the difference between the stored forward voltage drop measurements.

11. The method of claim 10, wherein the at least one temperature sense diode comprises the string of first diodes and the string of second diodes.

12. The method of claim 10, further comprising a single programmable current source that can be programmed to drive the first and second known currents.

13. The method of claim 12, wherein the integrated circuit comprises the single current source.

* * * * *

UNITED STATES PATENT AND TRADEMARK OFFICE
CERTIFICATE OF CORRECTION

PATENT NO. : 10,712,208 B2
APPLICATION NO. : 16/142824
DATED : July 14, 2020
INVENTOR(S) : A. Kiep et al.

Page 1 of 1

It is certified that error appears in the above-identified patent and that said Letters Patent is hereby corrected as shown below:

In the Claims

Column 11, Line 52 (Claim 2, Line 1), please change "and wherein" to -- wherein --.

Column 11, Line 65 & 66 (Claim 3, Lines 5 & 6), please change "transistor or power diode based" to -- transistor based --.

Column 12, Line 59 & 60 (Claim 10, Lines 7 & 8), please change "transistor or power diode based" to -- transistor based --.

Signed and Sealed this
Twenty-fifth Day of August, 2020

Andrei Iancu
*Director of the United States Patent and Trademark Office*